(12) United States Patent
Tanaka (10) Patent No.: US 8,208,267 B2
(45) Date of Patent: Jun. 26, 2012

(54) PRINTED WIRING BOARD WITH A BUILT-IN RESISTIVE ELEMENT

(75) Inventor: Hironori Tanaka, Ogaki (JP)

(73) Assignee: Ibiden Co., Ltd., Ogaki-shi (JP)

( * ) Notice: Subject to any disclaimer, the term of this patent is extended or adjusted under 35 U.S.C. 154(b) by 937 days.

(21) Appl. No.: 12/166,867

(22) Filed: Jul. 2, 2008

(65) Prior Publication Data
US 2009/0145643 A1 Jun. 11, 2009

Related U.S. Application Data

(60) Provisional application No. 60/992,820, filed on Dec. 6, 2007.

(51) Int. Cl.
*H05K 1/18* (2006.01)
(52) U.S. Cl. ........ 361/761; 361/760; 361/762; 361/764; 174/260
(58) Field of Classification Search .................. None
See application file for complete search history.

(56) References Cited

U.S. PATENT DOCUMENTS

| 5,347,258 | A  | * | 9/1994  | Howard et al. ............... 338/333 |
| 5,383,093 | A  | * | 1/1995  | Nagasaka ..................... 361/771 |
| 6,278,356 | B1 | * | 8/2001  | Lin et al. ...................... 338/309 |
| 7,131,047 | B2 | * | 10/2006 | Welbon et al. ................ 714/734 |
| 7,679,925 | B2 | * | 3/2010  | Fukuoka et al. .............. 361/761 |
| 7,733,662 | B2 | * | 6/2010  | Chen ............................. 361/761 |
| 7,870,664 | B2 | * | 1/2011  | Das et al. ......................... 29/832 |

FOREIGN PATENT DOCUMENTS

| JP | 6-152093   | 5/1994  |
| JP | 2000-269624 | 9/2000  |
| JP | 2004-296984 | 10/2004 |

* cited by examiner

*Primary Examiner* — Boris Chervinsky
(74) *Attorney, Agent, or Firm* — Oblon, Spivak, McClelland, Maier & Neustadt, L.L.P.

(57) ABSTRACT

A printed wiring board with a built-in resistive element comprising a first electrode formed on the surface of an insulating member, a second electrode provided adjacent to the first electrode to form a space therebetween, a resistor-filling part formed by the space between the first electrode and the second electrode, and a resistive element comprising a resistive material provided in the resistor-filling part wherein the resistor-filling part is substantially enclosed by the first electrode and the second electrode.

20 Claims, 9 Drawing Sheets

PRINTED WIRING BOARD WITH A BUILT-IN RESISTIVE ELEMENT

RELATED APPLICATION

This application claims the benefit of U.S. Provisional Application Ser. No. 60/992,820 filed Dec. 6, 2007, the entire content of which is incorporated herein by reference.

FIELD OF THE INVENTION

The present invention relates generally to a printed wiring board, and more specifically to a printed wiring board having a built-in resistive element.

DESCRIPTION OF THE RELATED ART

A printed wiring board mounts and secures semiconductor parts (active parts) such as an IC or LSI, and electronic parts (passive parts) such as an inductor, a resistor or capacitor so that they are electrically connected to each other. Therefore, a conventional printed wiring board is formed by a conductive circuit formed on the surface as well as inside an insulating resin base board for mounting parts and a base board for mutual electrical connections.

SUMMARY OF THE INVENTION

One aspect of the invention includes a printed wiring board with a built-in resistive element. The printed wiring board includes a first electrode formed on the surface of an insulating member, a second electrode provided adjacent to the first electrode to form a space therebetween and a resistor-filling part formed by the space between the first electrode and the second electrode. A resistive element includes a resistive material provided in the resistor-filling part, wherein the resistor-filling part is substantially enclosed by the first electrode and the second electrode.

Another aspect includes a method of manufacturing a printed wiring board with a built-in resistive element. The method includes forming a first electrode on a surface of an insulating member, forming a second electrode on the surface of the insulating member so as to form a substantially enclosed space between the first and second electrodes. A resistor material is filled into the substantially enclosed space.

Still another aspect includes a method of manufacturing a printed wiring board with a built-in resistive element. The method includes forming a first electrode on a surface of an insulating member, forming a second electrode adjacent to the first electrode to form a space therebetween, which provides a resistor-filling part between the first electrode and the second electrode. A resistive element is formed by filling a resistive material provided in the resistor-filling part such that the resistor filling part is substantially enclosed by the first electrode and the second electrode.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Referring now to the drawings, wherein like reference numerals designate identical or corresponding parts throughout the several views.

In recent years, in conjunction with the trend of electronic devices becoming faster and having a higher frequency, internally installing passive parts onto a printed wiring board in advance is desirable in order to enhance the quality property (signal integrity) of transmission signals. The present invention relates to a printed wiring board in which a resistive element as one of such passive parts has been preliminarily built-in.

Japanese Unexamined Patent Application Publication 2006-24740 "Resistive Element and Multilayer Printed Wiring Board Incorporating the Same Therein" (Disclosure date: Jan. 26, 2006), the entire content of which is hereby incorporated by reference, describes a printed wiring board with a built-in resistive element. In FIG. 1 and the abstract of this reference, a square-shaped resistive element viewed as a plane drawing has been described.

The resistance value R of such a square-shaped resistive element formed on a printed wiring board, such is proportional to the length L between both electrodes and is inversely proportional to the area of a cross-section S of a resistive material. The area of the cross-section S is determined by the width W and the height (thickness) t of the resistive material, $R = \rho \cdot L/S = \rho \cdot L/(W \cdot t)$, where $\rho$ is the resistance rate determined by the resistive material.

Herein, when forming the resistive material by printing, the printing precision of the resistive material becomes an issue. Specifically, in the case of screen-printing of a resistive material onto a printed wiring board and further drying by heat or hardening by heat (hereinafter, simply referred to as "thermal drying"), controlling the width W and the height (thickness) t of the resistive material with very high precision is difficult. Consequently, the resistance value tolerance (variance) of the resistive element inevitably tends to be greater.

In view of the abovementioned objective, a purpose of the present invention is to provide a new printed wiring board with a built-in resistive element capable of reducing the resistance value tolerance (variance) of the resistive element and electronic apparatus using the same.

According to embodiments of the present invention, a new printed wiring board with a built-in element capable of reducing the resistance value tolerance (variance) of the resistive element and electronic apparatus using the same may be provided.

Hereinafter, with regard to a printed wiring board with a built-in resistive element related to the present invention and an electronic apparatus using the same, the embodiment will be described in detail while referring to the attached drawings. Furthermore, the same reference symbols are given for the same or similar components in the drawings, and redundant descriptions are generally omitted.

Figure 1A:
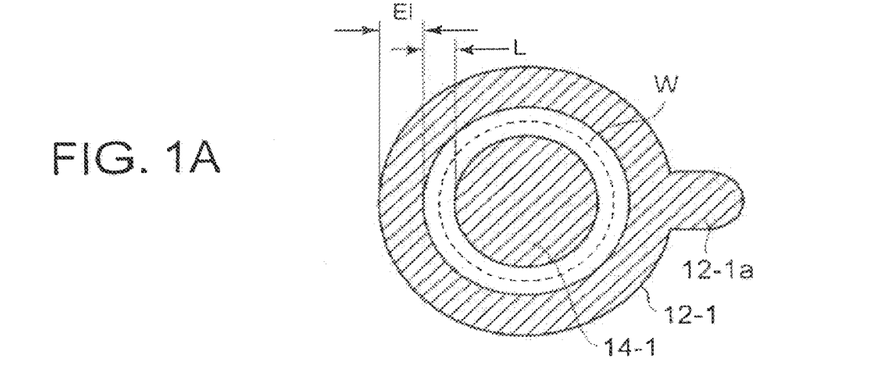
FIGS. 1A to 1C are diagrams describing a configuration and method of producing a representative resistive element in accordance with one embodiment of the invention.
Figure 1B:
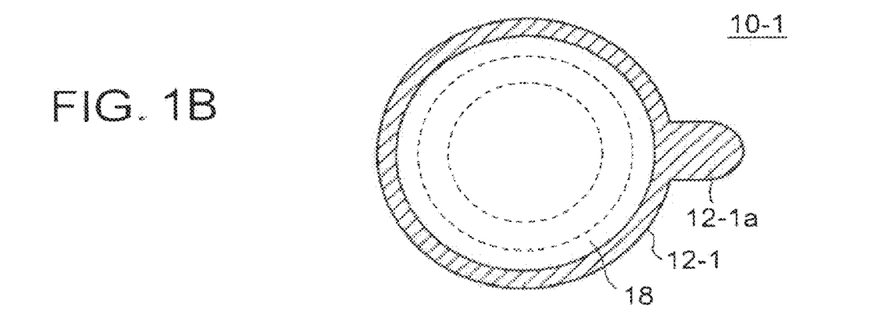
Figure 1C:
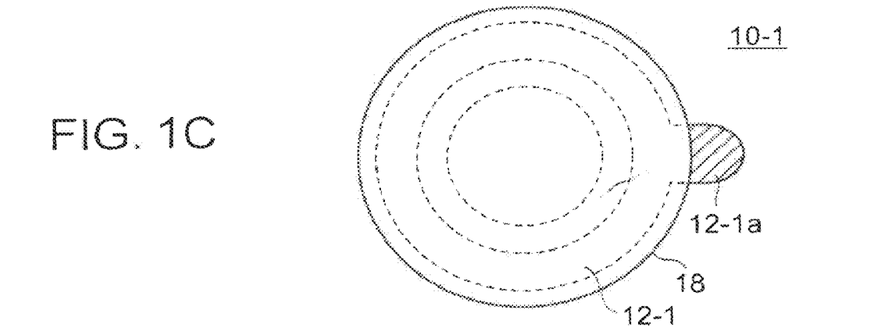

FIGS. 1A to 1C are diagrams describing the structure and method of producing a representative resistive element 10-1. As shown in FIG. 1A, this resistive element 10-1 has two electrodes. For example, these electrodes may be a circular center electrode 14-1 and a toric peripheral electrode 12-1 surrounding the circular center electrode. An extracting conductor from the center electrode 14-1 may be a through-hole conductor (not shown) or a via conductor (not shown). An extracting conductor from the peripheral electrode 12-1 may be a through-hole conductor (not shown) or a via conductor (not shown) formed on the toric peripheral electrode 12-1 or an extracting conductor pattern 12-1a from the peripheral electrode.

In an embodiment, space between the center electrode 14-1 and the peripheral electrode 12-1 is enclosed. Additionally, such space has the same radial length around the circumference.

As shown in FIG. 1B, a resistor material 18 is screen-printed on the entire space formed between the two electrodes. This resistor material 18 is typically resistive paste (referred to as "carbon paste" due to the quality of the material in most cases). This resistive paste 18 preferably has, for example, heat-hardening resin and conductive filler as main components. For heat-hardening resin, heat-hardening resin such as epoxy resin, phenol resin, melamine resin, polyimide resin, and the like, and resin with the above resins degenerated, or a mixture of these resins, thermoplastic resins, and the like may be used. Of these, it is preferable to use epoxy resin or phenol resin from the perspective of adhesion to a substrate, chemical resistance, and cost. For conductive filler, it is preferable to use inexpensive carbon such as ketjen black, acetylene black, graphite, activated carbon, and the like. Besides conductive filler, inorganic filler such as silica may be added. Commercially available carbon paste may be used as-is.

Carbon paste such as resistive paste manufactured by Shoei Chemical Inc., Ru resistive paste by Sumitomo Metal Mining Co., Ltd., resistor by Tanaka Kinzoku Group, polymer type resistive paste by Asahi Chemical Research Laboratory Co., Ltd., and the like may be used, and these are commercially available on the market. After the resistor material 18 is printed, it is thermally dried. In an embodiment, resistive element 10-1 comprises a resistive material. In another embodiment, the resistive element may include two electrodes and a resistor material formed between those electrodes.

As shown in FIG. 1C, the resistor material 18 may be printed off to the outside of the peripheral electrode 12-1. The resistance value of the resistive element 10-1 shown in FIG. 1C is the same as that shown in FIG. 1B. Furthermore, as long as the resistor material 18 is printed on the entire surface of the space between the two electrodes, the resistor material 18 may not be printed on part of the surface of the peripheral electrode 12-1 or the center electrode 14-1.

Geometries of the center electrode 14-1 and the peripheral electrode 12-1 are patterned and formed with a subtractive method, semi-additive method (SAP), full-additive method, or the like. Of these, the semi-additive method (SAP) is preferable from the perspective that electrodes with very high precision can be formed and the space (interspace) surrounding the two electrodes can also be formed with very high precision.

As shown in FIG. 1A, the resistance value of the resistive element 10-1 is determined by the resistivity $\rho$ of the resistor material, the length (i.e., distance between the two electrodes) L, the width (i.e., length of circular line running through the middle of the toric space formed between the two electrodes) W, and the thickness t of the print resistance. Of these, the distance L and the width W are determined by the geometries of the two electrodes, so they are formed with very high precision. Consequently, the resistance tolerance of the resistive element 10 can naturally become lower.

In other words, by forming the center electrode 14-1 and the peripheral electrode 12-1 with high precision with the semi-additive method (SAP), for example, the space (interspace) between the two electrodes can be maintained at high precision. If the resistor material is printed on the entire enclosed space between the two electrodes, it is not necessary to strictly control across-the-width application of the resistor material in printing for the purpose of reducing resistance tolerance as in the case of forming a conventional rectangular resistive element. More specifically, even if the resistor material is printed slightly off center, reduction of resistance tolerance can be achieved.

Figure 1D:
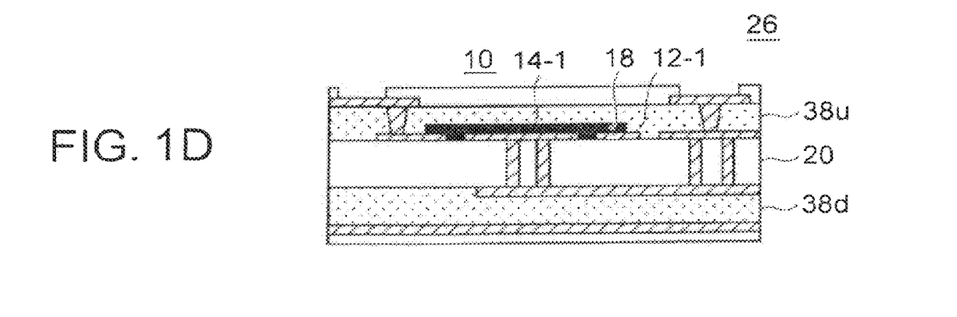
FIG. 1D is a cross-sectional diagram in the through-thickness direction of a typical printed-wiring board with a built-in resistive element, having the resistive element of FIGS. 1A to 1C.

FIG. 1D is a cross-sectional diagram in the through-thickness direction of a printed-wiring board with a built-in resistive element 26 using the above resistive element 10. This printed-wiring board has a core layer 20 and built-up layers 38u, 38d respectively formed on the core layer. The resistive element 10 is formed on the upper surface of the core layer 20.

The circular resistance 10-1 shown in FIG. 1B or 1C will be explained from the design aspect. Calculation of a resistance value R is the same as a rectangular resistor material. A resistance value R of a resistor material is shown in $R=\rho \cdot (L/S)$, wherein the section area S of the resistor material is shown in multiplication of the width W and the height (thickness) t of the resistor material.

If the thickness t is included in the resistivity $\rho$, the resistance value R is $R=\rho\{L/(W \cdot t)\}=(\rho/t) \cdot (L/W)=Rs \cdot (L/W)$, wherein Rs is referred to as sheet resistance. The sheet resistance Rs is one of the methods of expressing the resistance of a film with a consistent thickness, and the unit is ($\Omega/\square$) (ohm/square). In other words, it is a resistance value of a square (L=W) resistive film.

The resistance value R of the circular resistance shown in FIGS. 1B and 1C is shown as in Table 1 with print resistance of 100 ($\Omega/\square$) of sheet resistance. See FIG. 1A for the numerals of Table 1. The length of the peripheral electrode E1 and the through-hole diameter Dpth formed on the back surface of the center electrode are consistent. As shown above, the resistive element 10 can be designed after a target resistance value is set in advance.

TABLE 1

| No. | L (μm) | W (μm) | R (Ω) | E1 (μm) | Dpth (μm) |
|---|---|---|---|---|---|
| 1 | 250 | $2.28 \times 10^3$ | 11 | 250 | 475 |
| 2 | 150 | $1.96 \times 10^3$ | 7.7 | | |
| 3 | 100 | $1.81 \times 10^3$ | 5.5 | | |
| 4 | 75 | $1.73 \times 10^3$ | 4.3 | | |

Figure 2A:
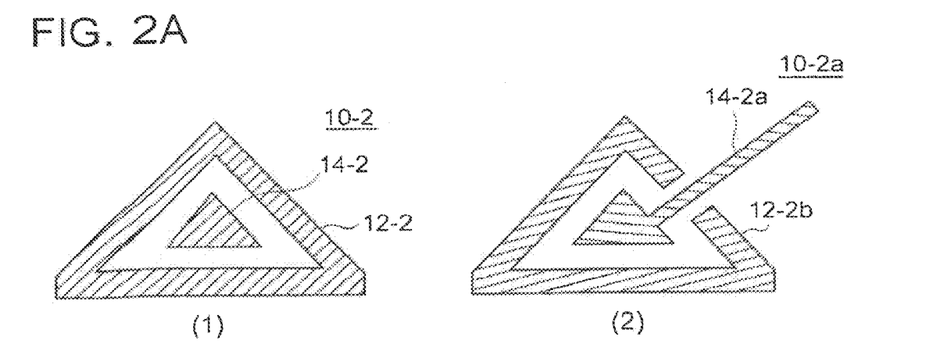
FIGS. 2A to 2C are example embodiments modified from the electrode geometry of FIG. 1A.
Figure 2B:
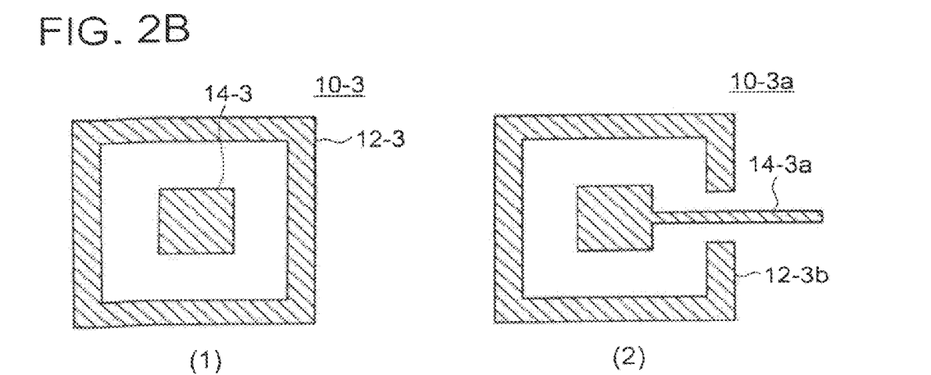
Figure 2C:
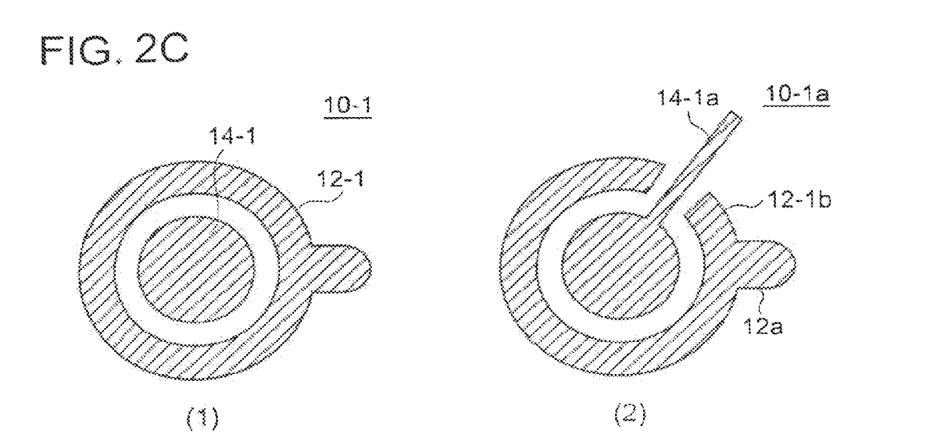

FIGS. 2A to 2C are modified examples of circular geometries of the electrodes of FIG. 1A. The resistor material is not shown below, but in FIG. 2A (1), a center electrode 14-2 is a triangle and a peripheral electrode 12-2 is the geometry of a triangular frame. In FIG. 2B (1), a center electrode 14-3 is rectangular, peripheral electrode 12-3 is a geometry of a rectangular frame. As for other polygons, although not shown in the drawings, the center electrode can be an n-gon, and the peripheral electrode can be an n-gonal frame (wherein, n=3, 4, 5, . . . ). FIG. 2C (1) shows the same geometries of the electrodes shown in FIG. 1A.

However, when electrode geometries are generalized, the center electrode may be any geometry. Moreover, the peripheral electrode may be any geometry as long as it substantially or completely surrounds the center electrode. Moreover, the center electrode is not necessarily formed in the center of the peripheral electrode, and may be off centered. In other words, the space between the two electrodes may preferably be an enclosed area. The two electrodes are formed with very high precision by patterning.

Therefore, as long as the space enclosed between the two electrodes can be formed, it is unnecessary to strictly control the width of a resistor material in printing such resistor material. More specifically, even if a resistor material is printed slightly off center, the length and width of the resistor material that naturally makes the resistance tolerance optimal can be obtained if these two electrodes are accurately formed and the resistor material is printed on the entire space between them, because the width of the resistor material depends on the forming precision between the two electrodes. In particular, the length and width of the resistor material printed on the space between the two electrodes can be formed with very high precision. Consequently, this may reduce the resistance tolerance of the resistive element.

Figure 3A:
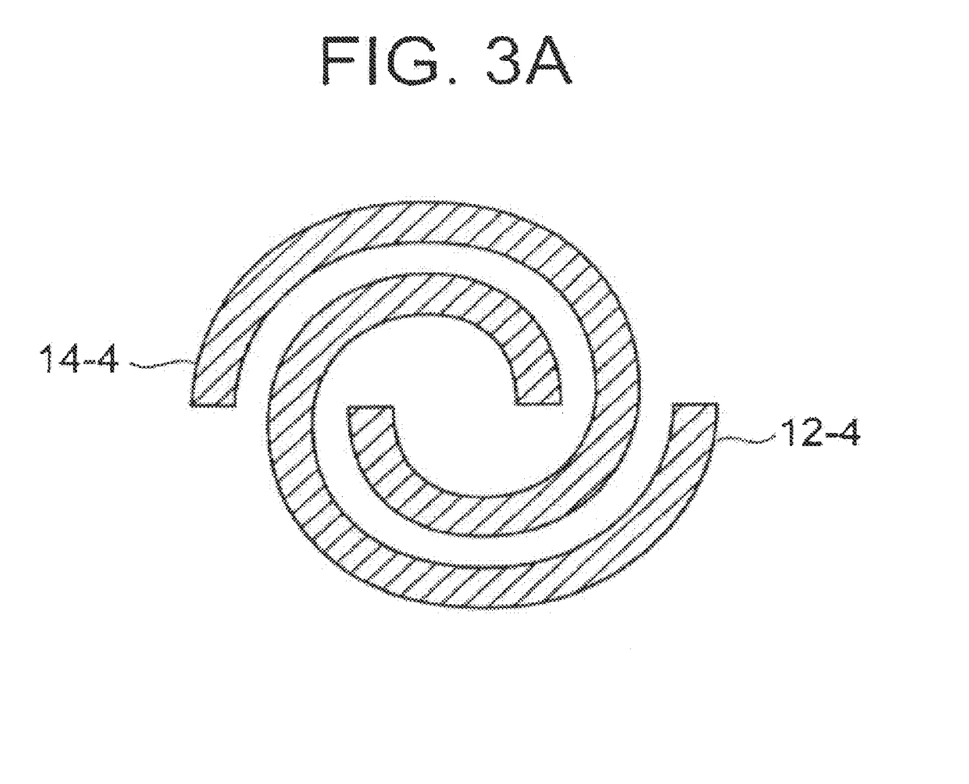
FIG. 3A to FIG. 3B are other example embodiments modified from the electrode geometry of FIG. 1A.
Figure 3B:
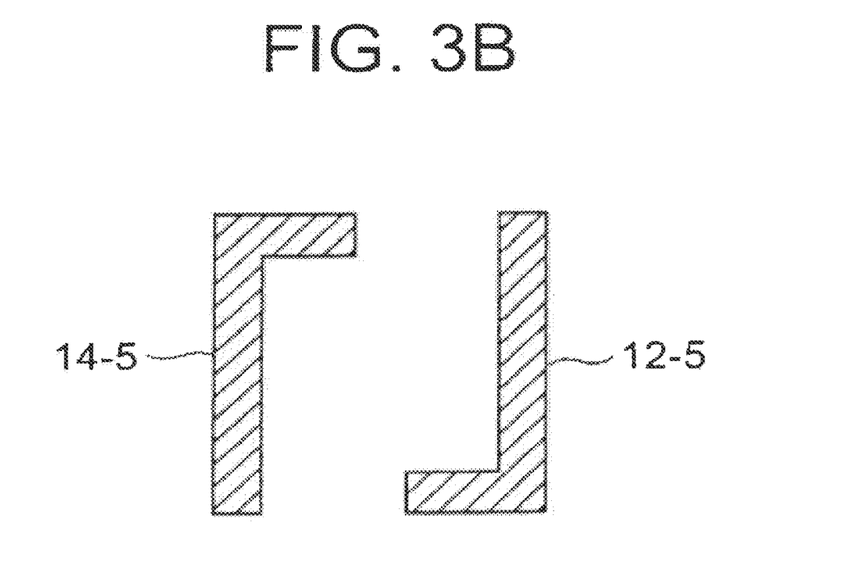

Moreover, the space between these two electrodes is not necessarily completely enclosed. More specifically, as shown in FIG. 3A, positive and negative electrodes 12-4, 14-4 forming a resistive element may be formed in whorl respectively, and, as shown in FIG. 3B, positive and negative electrodes 12-5, 14-5 forming a resistive element may be formed in angled brackets. With a structure in which the space between a pair of electrodes as above is not enclosed and the space between such pair of electrodes is opened, the space between the two electrodes can be regarded as substantially enclosed unless it is in a range that affects the resistance tolerance.

Furthermore, in the resistive element 10-2 with the triangle electrodes shown in FIG. 2A (1), the resistive element 10-3 with square electrodes shown in FIG. 2B (1), and the resistive element 10-1 with circular electrodes shown in FIG. 2C (1), the resistance values can be calculated in advance relatively easily.

However, with regard to other electrode geometries, more than one sample that has electrodes with slightly different dimensions (more specifically, similar electrodes) is formed in advance using a single-layer substrate, a resistor material 18 is printed and thermally dried, and the size of the electrodes with an intended resistance value can be determined via an experiment by sequentially measuring resistance values of these samples.

In the end, the electrode geometry may preferably be one of the following:

(1) Electrodes that form space enclosed between two electrodes;

(2) A center electrode and a peripheral electrode that surrounds it;

(3) A circular center electrode and a toric peripheral electrode;

(4) A center electrode that is an n-gon and a peripheral electrode that is an n-gonal frame (wherein, n=3, 4, 5, . . . ).

With these electrode geometries, the space enclosed between the two electrodes can be formed, and by printing the resistor material on the entire surface of this space and thermally drying, the resistive element 10 can be formed with high precision of resistance value.

The extracting conductor from the peripheral electrode 12 generally does not affect the space between the two electrodes or cause problems. When the extracting conductor from the center electrode 14 is a through-hole conductor or a via conductor, it generally does not effect the space between the two electrodes or cause problems.

However, due to the design, a through-hole conductor or a via conductor may not be possible to be formed for the center electrode 14. In this case, a conductor pattern has to be extracted from the center electrode 14. FIG. 2A (2) is an example of a resistive element 10-2 with triangle electrodes shown in FIG. 2A (1) in which a part of a peripheral electrode 12-2b is eliminated and an extracting conductor pattern 14-2a from a center electrode 14-2 is formed. FIG. 2B (2) is an example of a resistive element 10-3 with square electrodes shown in FIG. 2B (1) in which a part of a peripheral electrode 12-3b is eliminated and an extracting conductor pattern 14-3a from a center electrode 14-3 is formed. FIG. 2C (2) is an example of a resistive element 10-1 with circular electrodes shown in FIG. 2C (1) in which a part of a peripheral electrode 12-1b is eliminated and an extracting conductor pattern 14-1a from a center electrode 14-1 is formed. As for other polygons, although not shown in the drawings, an extracting conductor pattern from a center electrode can also similarly be formed.

With these electrode geometries, the space between the two electrodes is not completely enclosed. However, the space between the two electrodes is mostly enclosed (more specifically, substantially enclosed), and the two electrodes are formed with high precision, for example, with the semi-additive method, so the length and width of the resistor material can be formed mostly accurately. Consequently, printing of the resistor material 18 on the entire space between these two electrodes and thermally drying it makes the resistance tolerance of the resistive element 10 lower than conventional rectangular resistance. More specifically, even if the printing precision is slightly poor (e.g., as in FIG. 1C, the resistor material is not exactly on the peripheral electrode), the resistance tolerance is not affected at all.

Furthermore, it is important to pay attention so that the resistor material is not printed on the portion where the extracting conductor pattern 14-2a, etc., passes the eliminated portion of the peripheral electrode 12-2b, etc. (more specifically, space between the extracting conductor pattern and the peripheral electrode). This space between the two electrodes is very narrow and open between the two electrodes, and this prevents electrical current from passing through this space by the resistor material being printed on this space.

The abovementioned resistive element 10 can be formed on various printed-wiring boards. The present applicant often adopts a buildup method using a core layer as a method of manufacturing printed-wiring boards. Therefore, a printed-wiring board with a built-in resistive element manufactured with the buildup method using a core layer is explained herein.

The buildup method using a core layer is a manufacturing method with which insulating layers are formed one-by-one on a core layer generally produced via the PTH (Plated Through Hole) method to create a conductor pattern, which are connected between the layers and are multi-layered by laminating the conductor layers. On the core layer, a through-hole conductor and a pattern conductor are formed on an insulating substrate. On a buildup layer laminated on the core layer, a via conductor and a pattern conductor on an insulating layer are formed.

The resistive element may be considered only the resistive material within the space formed by the electrodes, or can be considered the resistive material as well as the electrode and other structures associated with the resistive material. Table 2 shows classifications and a summary of the printed-wiring board with a built-in resistive element according to locations where the resistive element 10 is formed and types of conductors connected to the two electrodes.

TABLE 2

Figure 4A:
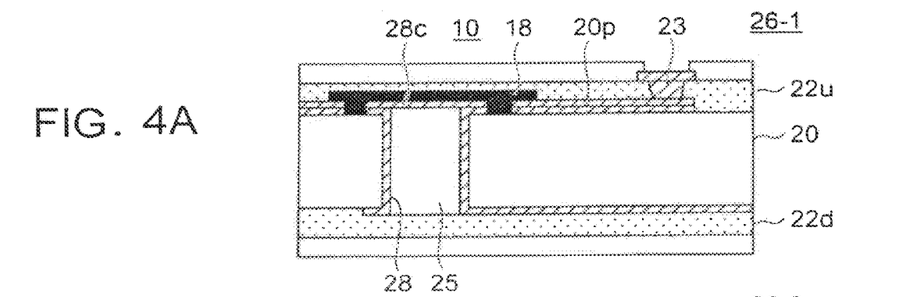
FIG. 4A to FIG. 4D are diagrams showing example printed-wiring boards with built-in resistive elements, with resistive elements formed on core layers, respectively.
Figure 4B:
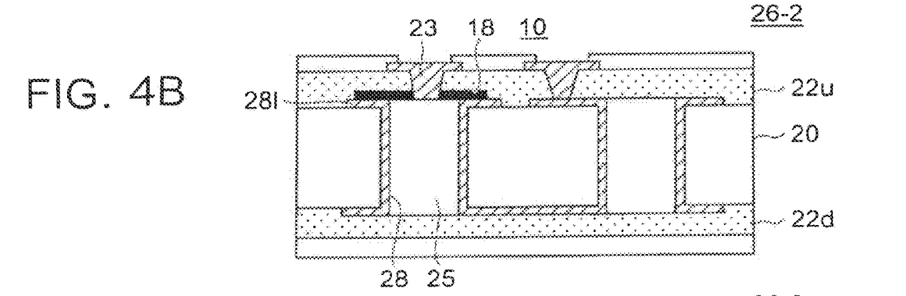
Figure 4C:
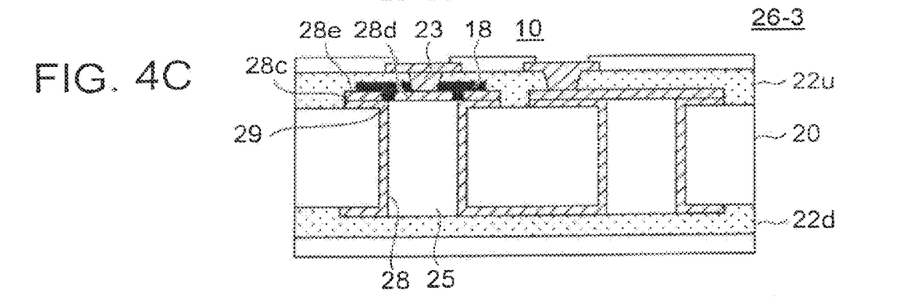
Figure 4D:
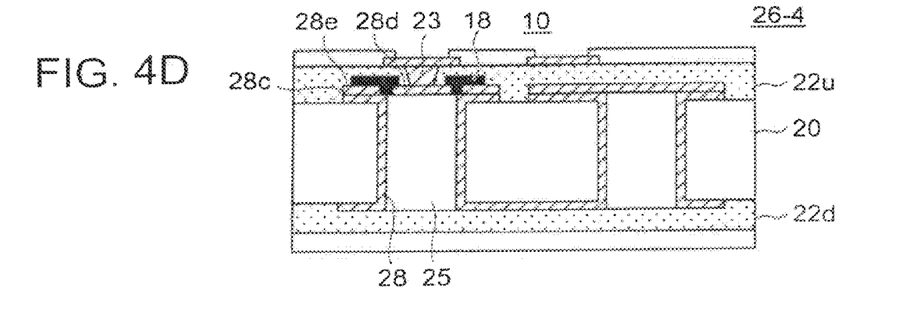
Figure 5A:
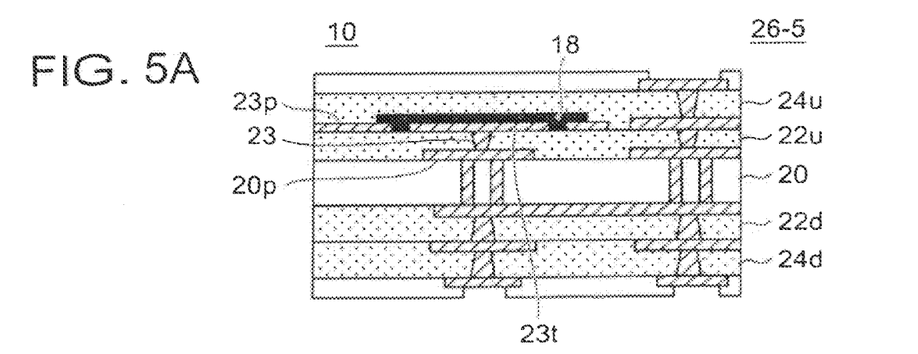
FIG. 5A to FIG. 5B are diagrams showing example printed-wiring boards with built-in resistive elements, with resistive elements formed on interlayer insulating resin layers of built-up layers, respectively.
Figure 5B:
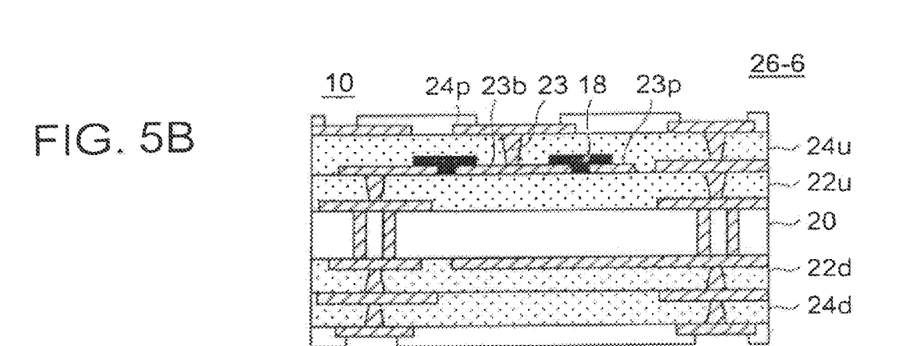

| No. | Forming location | Conductor connected to one electrode | Conductor connected to the other electrode | Drawing |
| --- | --- | --- | --- | --- |
| 1 | Core layer | PTH cover-plating | Pattern | FIG. 4A |
| 2 | | Via | TH land | FIG. 4B |
| 3 | | Via | TH land | FIG. 4C |
| 4 | | PTH cover-plating | TH land | FIG. 4D |
| 5 | Buildup layer | Via topland | Pattern | FIG. 5A |
| 6 | | Via bottomland | Pattern | FIG. 5B |

The resistive element 10 of the printed-wiring board with a built-in resistive element 26-1 shown in FIG. 4A has a PTH cover (or lid) plated conductor 28c as one electrode (center electrode) and a conductor pattern 20p on the surface of a core substrate 20 as the other electrode (peripheral electrode). A filling material 25 is filled in the interior portion of the PTH 28, and a PTH cover (or lid) plated conductor 28c formed with high precision, for example, with the semi-additive method or tinting method is formed with the resistor material 18 formed on the upper surface. Additionally, the conductor pattern 20p is a circular shape surrounding the PTH cover (or lid) plated conductor 28c.

The resistive element 10 of the printed-wiring board with a built-in resistive element 26-2 shown in FIG. 4B has a via conductor 23 as one electrode (center electrode) and a TH (through-hole) land 28l as the other electrode (peripheral electrode). The filling material 25 is filled in the interior portion of the PTH, and the resistor material 18 is formed on the upper surfaces of the filling material and the PTH pad. In the embodiment of FIG. 4B, a cover (or lid) plated conductor for covering the filling material in the interior portion of the PTH is not formed.

The resistive element 10 of the printed-wiring board with a built-in resistive element 26-3 shown in FIG. 4C has a via conductor 23 on TH cover (or lid) plating as one electrode (center electrode) and an outer edge 28e on the TH cover (or lid) plating 28c as the other electrode (peripheral electrode). In this case, the filling material 25 is filled in the interior portion of the PTH, and a groove 29 is formed on the peripheral portion of a via conductor 23 on the TH cover (or lid) plating 28. Thereby, the central portion 28d and the outer edge 28e are separated. Additionally, the via conductor 23 is formed on that central portion 28d. Furthermore, in this configuration, the via conductor 23 on the TH cover (or lid) plating 28c is not essential. In this case, the inner portion is regarded as the center electrode with the groove 29 provided on the TH cover (or lid) plating 28c as a boundary, and the outer portion is regarded as the peripheral electrode with said groove as a boundary.

The resistive element 10 of the printed-wiring board with a built-in resistive element 26-4 shown in FIG. 4D has a central portion 28d of a TH cover (or lid) plating 28c as one electrode (peripheral electrode) and an outer edge 28e of a TH cover (or lid) plating 28c as the other electrode (center electrode). The filling material 25 is filled in the interior portion of the PTH, the PTH cover (or lid) plated conductor 28c is partially formed on this filling material, and a via conductor 23 is formed on the upper surface of the PTH cover (or lid) plated conductor.

The printed-wiring board with a built-in resistive element 26-5 shown in FIG. 5A has a resistive element 10 that has a first conductor circuit 20p formed on the surface of a first insulating member 20, second conductor circuits 23t, 23p formed on the surface of a second insulating member 22u, which is located on the first insulating member, and a via conductor 23 that connects the first conductor circuit and the second conductor circuits, and has said second conductor circuits 23t, 23p as the two electrodes. More specifically, the resistor material 18 is formed on a built-up layer (a first interlayer insulating resin layer 22u). In this case, one of the electrodes (center electrode) is a topland 23t of a via conductor 23, and the other electrode (peripheral electrode) is the conductor pattern 23p formed on the periphery of the topland 23t of the via conductor 23. Additionally, the conductor pattern 23p is a circular shape surrounding the topland 23t of the via conductor 23.

The printed-wiring board with a built-in resistive element 26-6 shown in FIG. 5B has a resistive element 10 that has first conductor circuits 23p, 23b formed on the surface of a first insulating member 22u, a second conductor circuit 24p formed on the surface of a second insulating member 24u, which is on the first insulating member, and a via conductor 23 that connects the first conductor circuits and said second conductor circuit, and has the first conductor circuits as the two electrodes. More specifically, the resistor material 18 is formed on a built-up layer (a first interlayer insulating resin layer 22u). One of the electrodes (center electrode) is a bottomland 23b of the via conductor 23, and the other electrode (peripheral electrode) is a conductor pattern 23p formed on the periphery of the bottomland 23b of the via conductor 23. Additionally, the conductor pattern 23p is a circular shape surrounding the bottomland 23b of the via conductor 23.

Furthermore, if the via conductor is not filled, a void may occur by printing the resistor material 18 on the hollow via conductor, though it is not shown in a diagram, and thus, it is preferable to avoid such a hollow portion as much as possible in forming the resistor material 18.

It is appreciated that the descriptions above are examples, and the resistor material 18 can be formed on other locations as needed.

Subsequently, an example method of manufacturing a printed-wiring board with a built-in resistive element using the buildup method using a core layer will be briefly explained.

Figure 6A:
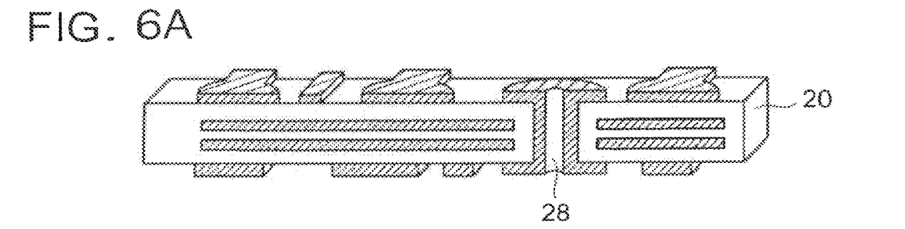
FIG. 6A to FIG. 6G are diagrams describing a method of producing a printed-wiring board with a built-in resistive element using a buildup method using a core layer in accordance with one embodiment of the invention.

As shown in FIG. 6A, a core substrate 20 is prepared. This core substrate 20 is produced with a plated through-hole method. An inner layer conductor pattern is formed on a glass fabric epoxy resin copper clad laminate or glass fabric high-heat-resistant resin copper clad laminate, and the necessary number of these is prepared, and laminated and adhered with adhesive sheets called prepreg in order to form one plate. A hole is made on this, and the wall surface and surface of the hole are plated with a plated through-hole method to connect the inner and outer conductor layers. Subsequently, a surface conductor pattern and electrode conductors (not shown) of the resistive element are created in order to produce the core substrate 20. As for plating, a method such as the subtractive method in which the entire surface can be plated and then a necessary area is etched, or the semi-additive method, full-additive method, or the like may be used.

When the resistive element 10 is formed on the core layer 20 explained in association with FIG. 4A-FIG. 4D, both electrode conductors are formed at this stage. Subsequently, the resistive paste 18 is printed on the enclosed space between these two electrodes and is thermally dried to form the resistive element 10.

Figure 6B:
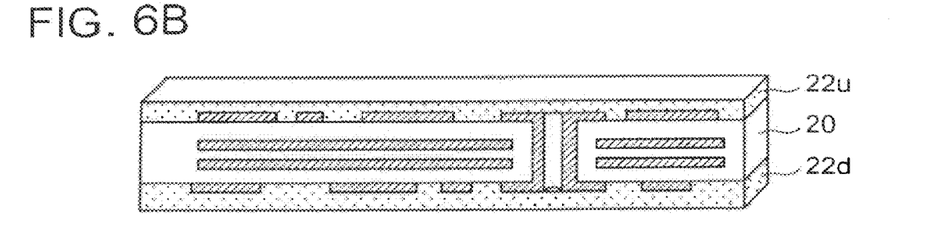

As shown in FIG. 6B, insulating layers 22*u*, 22*d* are formed on the core substrate 20 and a resistive element (not shown). These insulating layers are formed by coating liquid or a lamination method in which a film is heated and clamped in vacuo.

Figure 6C:
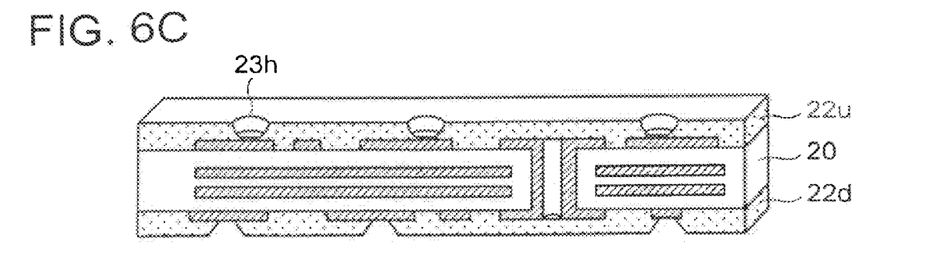

As shown in FIG. 6C, holes 23*h* are made on the insulating layers 22*u*, 22*d* via laser.

Figure 6D:
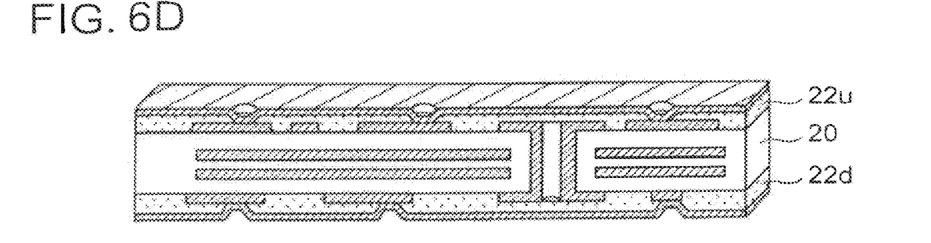

As shown in FIG. 6D, an electroless copper plating layer is precipitated on the inner surfaces of the holes and the surfaces of the insulating layers to make them conductive. At this time, to enhance the adhesion of the plating, the inner surfaces of the holes and the surfaces of the insulating layers are roughened.

Figure 6E:
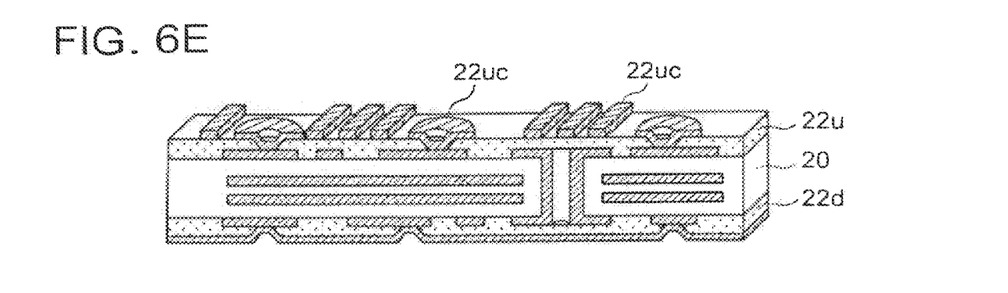

As shown in FIG. 6E, conductor patterns 22*uc* on the surface and electrode conductors (not shown) of the resistive element are formed. To form the conductor patterns and electrode conductors, panel plating, which is electrolytic copper plating, is performed on the entire surface followed by etching to form the conductor patterns (subtractive method). Furthermore, other methods, for example, the semi-additive method, full-additive method, or the like can be used.

When the resistive element 18 is formed on the built-up layer explained in association with FIG. 5A to FIG. 5B, electrode conductors are formed at this stage. Subsequently, the resistive paste 18 is printed on the enclosed space between these two electrodes and is thermally dried to form the resistive element 10.

Figure 6F:
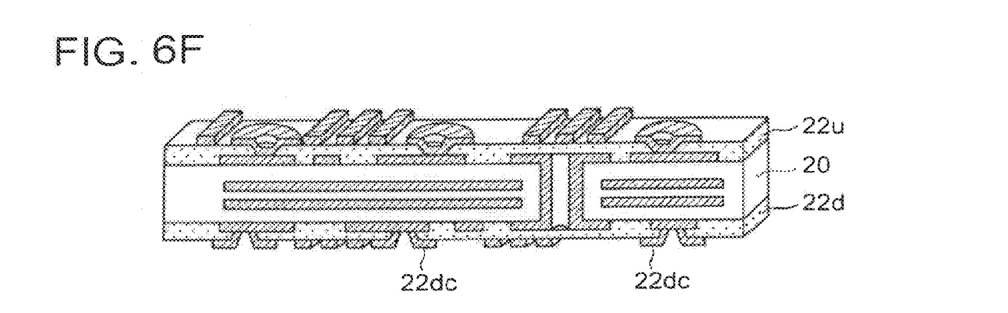

As shown in FIG. 6F, conductor patterns 22*dc* and electrode conductors (not shown) on the back surface are similarly formed. In the same manner, when a resistive element 10 is formed on this built-up layer, electrode conductors are formed at this stage, and the resistive paste 18 is printed on them and thermally dried to form the resistive element 10.

A first layer of each of the conductor patterns on the upper surface and lower surface is formed on the core layer 20 at this stage, so the process of FIG. 6B to FIG. 6F is repeated as many times as desired. At this time, the resistive element 10 can be formed on the desired layer.

Figure 6G:
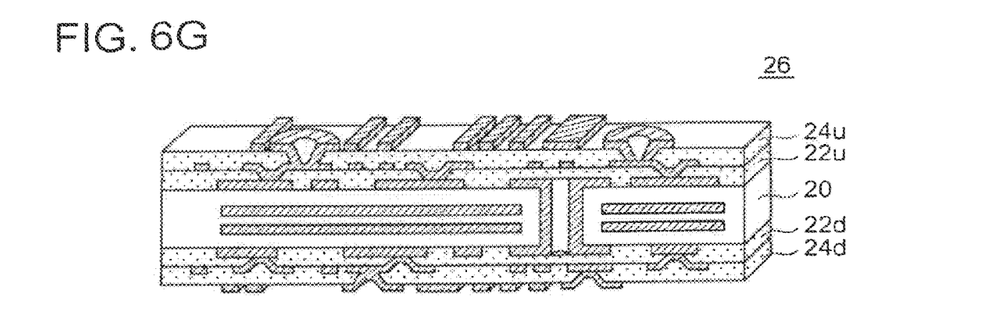

As shown in FIG. 6G, by repeating the process of FIG. 6B to FIG. 6F one more time, a multilayer printed-wiring board is produced. A solder mask layer (not shown) can be formed on the outermost layer as needed.

As shown in FIG. 1D and FIGS. 4A, 4C, 5A and 5B, it has been explained that the thickness of the resistor material 18 is preferably thicker than the thickness of the center electrode and peripheral electrode. However, it is not limited to the above.

Figure 7A:
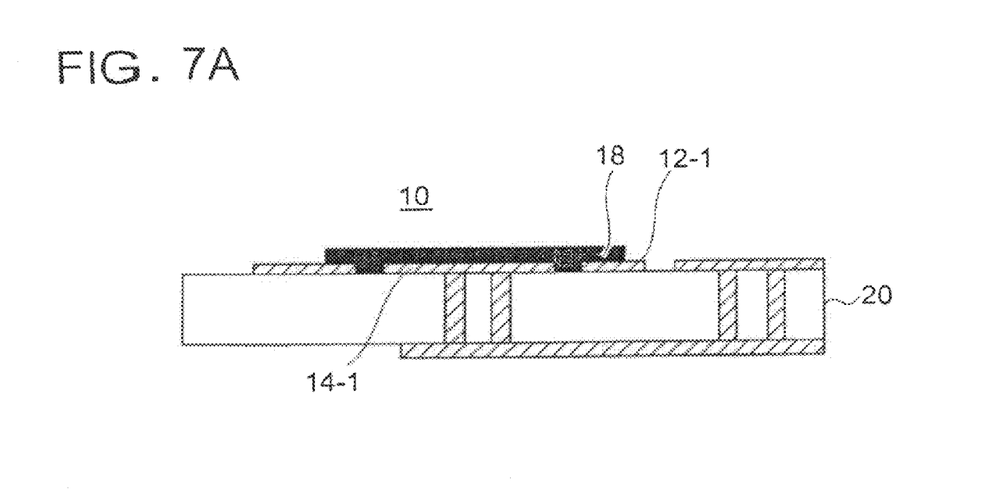
FIG. 7A is a diagram describing an example of a resistive element that has the thickness of the resistor material larger than a thickness of the center electrode and the peripheral electrode.

FIG. 7A is a cross-section diagram of the printed-wiring board with a built-in resistive element 26 in FIG. 1D at a stage in which the center electrode 14-1 and the peripheral electrode 12-1 are formed on the core layer 20, and the resistor material 18 is formed by being printed on the space between the two electrodes. The thickness of the resistor material 18 is preferably thicker than the thickness of the two center electrode 14-1 and the peripheral electrode 12-1 herein.

Figure 7B:
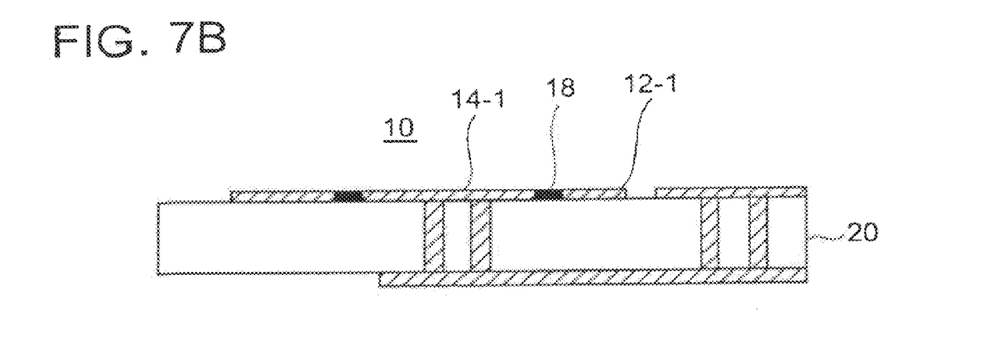
FIG. 7B is a diagram describing and example of a resistive element that has the thickness of the resistor material substantially equal to a thickness of the center electrode and the peripheral electrode.

At this time, as shown in FIG. 7B, the resistor material 18 may be scraped with a squeegee or another appropriate means prior to the thermal dry process to make the thickness of the resistor material 18 substantially equal to the thickness of the center electrode 14-1 and the peripheral electrode 12-1. As in the above, a resistive element that has the resistor material 18 sufficiently filled in the space between the two electrodes but not covering the center electrode 14-1 and the peripheral electrode 12-1 can further make the resistance tolerance lower than the resistive element in FIG. 7A.

Such resistive element that has the thickness of the resistor material substantially equal to the thickness of the center electrode and the peripheral electrode can also be adopted in the printed-wiring board of other embodiments such as those shown in FIGS. 4A, 4C, 5A, 5B, and the like.

Electronic devices configured by using the abovementioned printed-wiring board with a built-in resistive elements 26 are explained compared to current electronic devices. A device with electronic/electrical parts loaded on a printed-wiring board is called a printed circuit board or a package (PK) herein.

Figure 8A:
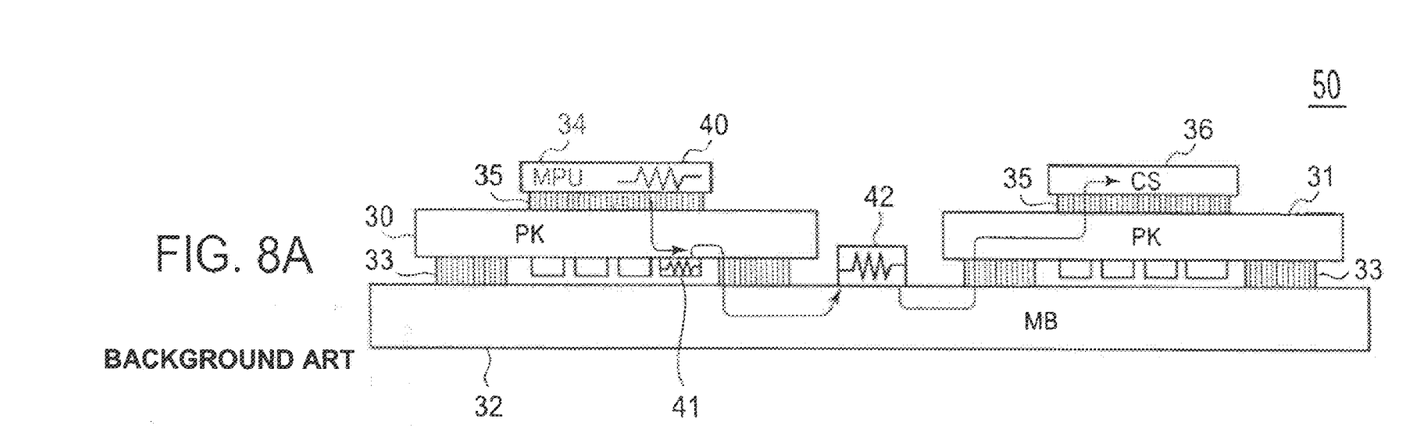
FIG. 8A is a diagram showing the configuration of a conventional electronic device 50.

FIG. 8A is a diagram showing the configuration of a conventional electronic device 50. On a motherboard (MB) 32, 2 packages (PK) 30, 31 are loaded, and a microprocessing unit (MPU) 34 is loaded on one of the PK 30, and a chip set (CS) 36 is loaded on the other PK 31. The MB 32 and the PK 30, 31 are respectively connected, for example, with pin joints 33, and the PK 30 and the MPU 34 or the PK 31 and the CS 36 are connected with pin joints or reflow soldering 35 using solder bumping.

With a higher frequency electronic device 50, many resistive elements may become necessary. Therefore, in the electronic device 50, resistive elements are off-centrally mounted as a resistive element 40 in the MPU, a chip resistive element 41 mounted on the PK 30, a chip resistive element 42 mounted on the MB 32, and the like.

To form the resistive element in the MPU 34, the size of the chip of the MPU naturally becomes larger. To mount the resistive element on the PK 30, the size of the PK naturally becomes larger. To mount the resistive element on the MB 32, the size of the MB naturally becomes larger. In addition, the chip resistive element 41 mounted on the PK 30 and the chip resistive element 42 mounted on the MB 32 are situated far from the MPU 34, so it may deteriorate the quality property of propagation signals.

Figure 8B:
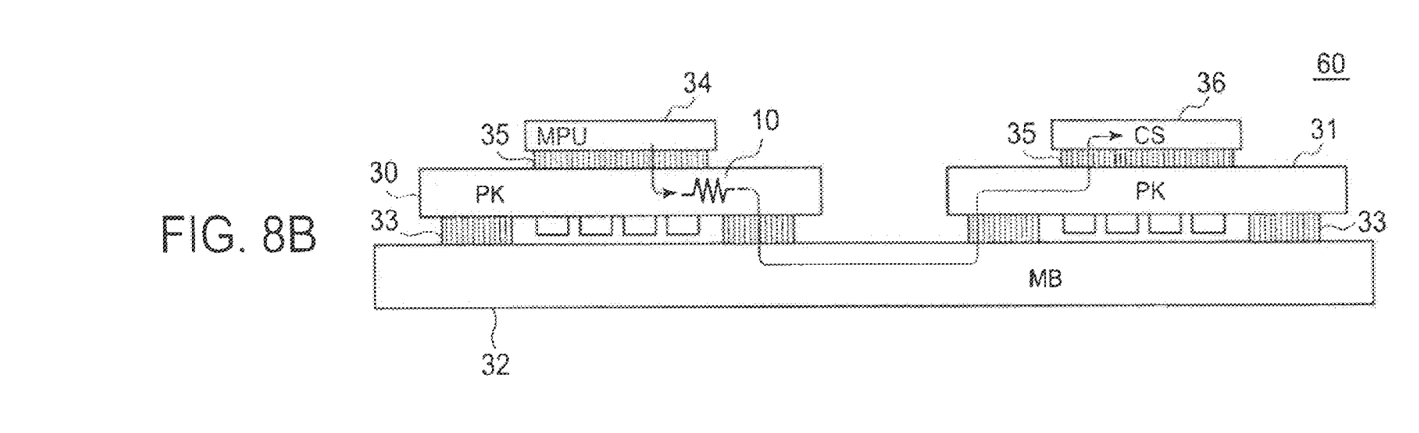
FIG. 8B is a diagram showing an electronic device configured by using the printed-wiring board with a built-in resistive element in accordance with an embodiment of the invention.

FIG. 8B is a diagram of an electronic device 60 configured using the printed-wiring board related to the present embodiment. Two packages (PK) 30, 31 are mounted on a motherboard (MB) 32, and a MPU 34 is mounted on one of the PK 30 and a CS 36 is mounted of the other PK 31. As mentioned above, a plurality of resistive elements 10 can be built on a printed-wiring board comprising the PK 30.

Therefore, the resistive element 40 in the MPU, the chip resistive element 41 mounted on the PK 30 and the chip resistive element 42 mounted on the MB 32 in the electronic device 50 shown in FIG. 8A can collectively be replaced with a resistive element with built-in printed-wiring board 10.

Because the electronic device 60 shown in FIG. 8B can have the resistive element situated close to the MPU 34, the quality property of propagation signals can be enhanced compared to the electronic device of FIG. 8A.

According to an embodiment, in a printed-wiring board with a built-in resistive element, the resistive element forms space enclosed between two electrodes, and by forming print resistance on this space, the resistor material can form a length L and width W with high precision. Therefore, variations of resistance values can be kept low.

According to an embodiment, in a printed-wiring board with a built-in resistive element, the resistive element has a center electrode and a peripheral electrode, and the peripheral electrode completely surrounds the center electrode. Thus, the space between the two electrodes is formed with high precision, so the resistor material to be formed hereon can form the length L and width W with a high precision.

According to an embodiment, in a printed-wiring board with a built-in resistive element, the resistive element can be formed on either a core layer or a built-up layer. Therefore, a plurality of resistive elements can be formed on one printed-wiring board.

According to an embodiment, by adopting a printed-wiring board with a built-in resistive element, a plurality of resistive elements can collectively be incorporated into a package. An electronic device configured with packages on which semiconductor devices are mounted and a motherboard on which a plurality of packages are mounted can have resistive elements close to the semiconductor device collectively, so an electronic device with high-quality property of propagation signals can be configured.

Embodiments of the printed-wiring board and electronic device using the same that are related to the present invention have been described above, but these are examples, and the present invention is not limited to these. Additions, eliminations, modifications, revisions, and the like that those skilled in the art can easily make with these embodiments are included in the present invention.

The invention claimed is:

1. A printed wiring board with a built-in resistive element comprising:
    a first electrode formed on the surface of an insulating member;
    a second electrode provided adjacent to the first electrode to form a space therebetween;
    a resistor-filling part formed by the space between the first electrode and the second electrode; and
    a resistive element comprising a resistive material provided in the resistor-filling part,
    wherein the first electrode is surrounded by the second electrode.

2. The printed wiring board with a built-in resistive element according to claim 1, wherein the resistor-filling part has a specified length along a width thereof.

3. The printed wiring board with a built-in resistive element according to claim 1, wherein the first electrode and the second electrode are formed by a semi-additive method.

4. The printed wiring board with a built-in resistive element according to claim 1, wherein a thickness of the resistive material is substantially the same as a thickness of the first electrode and substantially the same as a thickness of the second electrode.

5. The printed wiring board with a built-in resistive element according to claim 1, wherein a thickness of the resistive material is greater than a thickness of the first electrode and greater than a thickness of the second electrode.

6. The printed wiring board with a built-in resistive element according to claim 1, wherein the first electrode has a circular shape, and the second electrode has a ring-like shape around a periphery of the first electrode.

7. The printed wiring board with a built-in resistive element according to claim 1, wherein:
    the first electrode has a polygonal shape having n sides, and
    the second electrode has a polygonal shape having n sides (wherein, n=3 or more) so as to substantially surround a periphery of the first electrode.

8. The printed wiring board with a built-in resistive element according to claim 1, wherein:
    the insulating member comprises a filler provided within a through-hole,
    the first electrode comprises a through-hole lid plating provided so as to cover the filler, and
    the second electrode comprises a ring-shaped pattern provided so as to substantially surround the through-hole lid plating.

9. The printed wiring board with a built-in resistive element according to claim 1, wherein:
    the insulating member comprises a filler provided within a through-hole,
    the first electrode comprises a via conductor formed directly above the through-hole, and
    the second electrode comprises a land part of the through-hole.

10. The printed wiring board with a built-in resistive element according to claim 1, wherein:
    the insulating member comprises a filler provided within a through-hole and a through-hole lid plating provided so as to cover at least a portion of the filler,
    the first electrode comprises an inside portion bordering a groove an inner edge of which is defined by the through-hole lid plating, and
    the second electrode comprises the outside portion bordering the groove so as to define an outer edge of the groove.

11. The printed wiring board with a built-in resistive element according to claim 1, wherein:
    the insulating member comprises a through-hole formed by filling a filler therein and a through-hole lid plating provided so as to cover at least a portion of the filler,
    the first electrode comprises a via conductor formed on the through-hole lid plating, and
    the second electrode comprises an outer peripheral portion bordering a groove defined by the through-hole lid plating and the outer peripheral portion.

12. The printed wiring board with a built-in resistive element according to claim 1 comprising:
    a first conductor circuit formed on a surface of a first insulating member;
    a second conductor circuit formed on a surface of a second insulating member, the second insulating member located on the first insulating member; and
    a via conductor for connecting the first conductor circuit and the second conductor circuit,
    wherein the second conductor circuit comprises the first electrode and the second electrode.

13. The printed wiring board with a built-in resistive element according to claim 1 comprising:
    a first conductor circuit formed on a surface of a first insulating member;
    a second conductor circuit formed on a surface of a second insulating member, the second insulating member located on the first insulating member; and
    a via conductor for connecting the first conductor circuit and the second conductor circuit,
    wherein the first conductor circuit comprises the first electrode and the second electrode.

14. A printed wiring board with a built-in resistive element comprising:
- a first electrode formed on the surface of an insulating member;
- a second electrode provided adjacent to the first electrode to form a space therebetween;
- a resistor-filling part formed by the space between the first electrode and the second electrode; and
- a resistive element comprising a resistive material provided in the resistor-filling part, wherein:
  - the resistor-filling part is substantially enclosed by the first electrode and the second electrode,
  - the insulating member comprises a filler provided within a through-hole,
  - the first electrode comprises a through-hole lid plating provided so as to cover the filler, and
  - the second electrode comprises a ring-shaped pattern provided so as to substantially surround the through-hole lid plating.

15. The printed wiring board with a built-in resistive element according to claim 14, wherein the resistor-filling part has a specified length along a width thereof.

16. The printed wiring board with a built-in resistive element according to claim 14, wherein a thickness of the resistive material is substantially the same as a thickness of the first electrode and substantially the same as a thickness of the second electrode.

17. The printed wiring board with a built-in resistive element according to claim 14, wherein a thickness of the resistive material is greater than a thickness of the first electrode and greater than a thickness of the second electrode.

18. A printed wiring board with a built-in resistive element comprising:
- a first electrode formed on the surface of an insulating member;
- a second electrode provided adjacent to the first electrode to form a space therebetween;
- a resistor-filling part formed by the space between the first electrode and the second electrode; and
- a resistive element comprising a resistive material provided in the resistor-filling part, wherein:
  - the resistor-filling part is substantially enclosed by the first electrode and the second electrode
  - a first conductor circuit formed on a surface of a first insulating member;
  - a second conductor circuit formed on a surface of a second insulating member, the second insulating member located on the first insulating member; and
  - a via conductor for connecting the first conductor circuit and the second conductor circuit, and
  - the second conductor circuit comprises the first electrode and the second electrode.

19. The printed wiring board with a built-in resistive element according to claim 18, wherein a thickness of the resistive material is substantially the same as a thickness of the first electrode and substantially the same as a thickness of the second electrode.

20. The printed wiring board with a built-in resistive element according to claim 18, wherein a thickness of the resistive material is greater than a thickness of the first electrode and greater than a thickness of the second electrode.

* * * * *